United States Patent [19]

Lockwood

[11] Patent Number: 4,935,839

[45] Date of Patent: Jun. 19, 1990

[54] ELECTROSTATIC DISCHARGE TESTING DEVICE

[75] Inventor: Larry R. Lockwood, McMinnville, Oreg.

[73] Assignee: Trisys, Inc., Beaverton, Oreg.

[21] Appl. No.: 206,487

[22] Filed: Jun. 13, 1988

[51] Int. Cl.$^5$ .......................................... H01T 23/00
[52] U.S. Cl. .................................... 361/230; 307/110; 324/419; 324/537
[58] Field of Search ........................ 324/415, 418–419, 324/457, 500, 537; 361/120, 230; 320/1; 307/106, 110; 200/61.53

[56] References Cited

U.S. PATENT DOCUMENTS

| | | | |
|---|---|---|---|
| 4,028,615 | 6/1977 | Jansen et al. | 324/419 |
| 4,031,460 | 6/1977 | Jameel et al. | 324/419 |
| 4,617,542 | 10/1986 | Lutz et al. | 335/196 |
| 4,636,721 | 1/1987 | Howell et al. | 324/537 |
| 4,721,899 | 1/1988 | Weil | 320/1 |
| 4,742,427 | 5/1988 | Richman | 361/230 |

OTHER PUBLICATIONS

Military Specification MIL-STD-883C, Notice 7, Method 3015.6 Specification entitled Electrostatic Discharge Sensitivity Classification.

Primary Examiner—A. D. Pellinen
Assistant Examiner—Jeffrey A. Gaffin
Attorney, Agent, or Firm—Chernoff, Vilhauer, McClung & Stenzel

[57] ABSTRACT

An electrostatic discharge testing device employs magnetic reed relays in a switching array for selectively routing high-voltage, fast rise-time signals. The contacts of the reed relays are copper plated to minimize skin effect and thus decrease rise-time. Interposed between the glass enclosure and the magnetic coil of each reed relay is a metal-plated dielectric sheet formed in a tube with the plated side facing out. The plating at each end of the tube is connected to a ground reference voltage via a resistor.

8 Claims, 2 Drawing Sheets

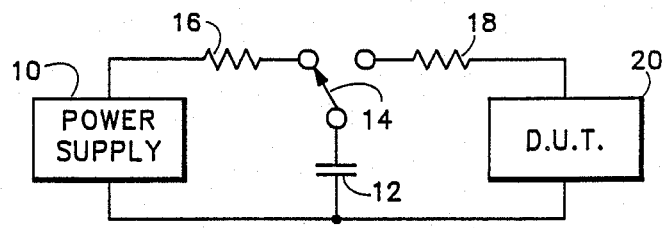
FIG.1
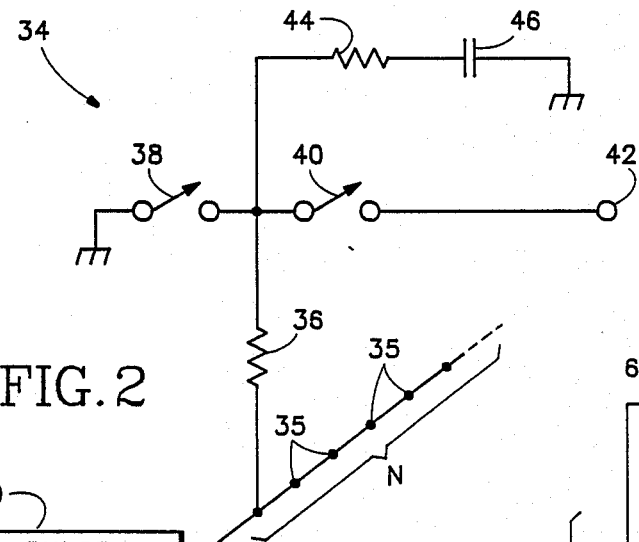
FIG.2
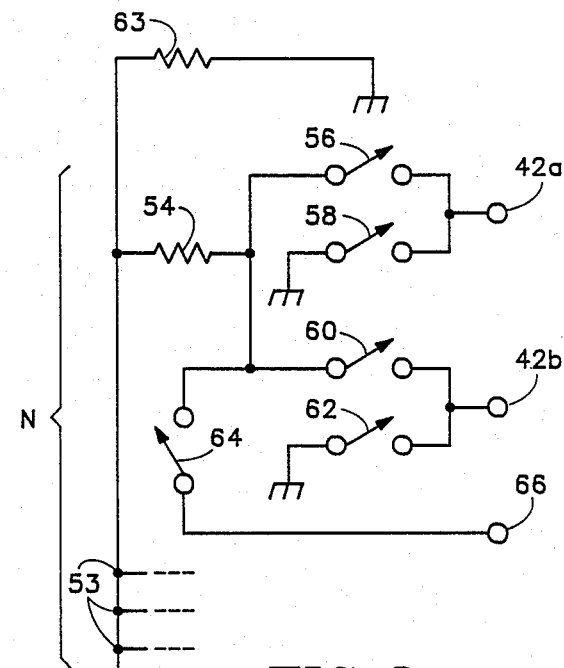
FIG.3
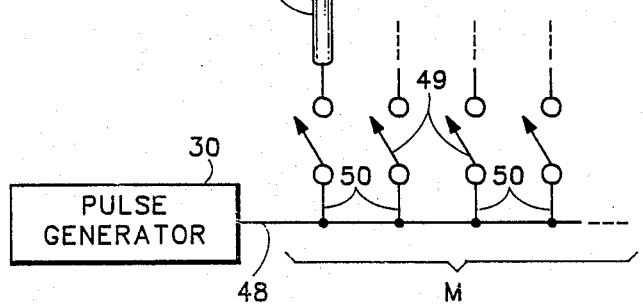

ELECTROSTATIC DISCHARGE TESTING DEVICE

TECHNICAL FIELD

The present invention relates to the field of testing an electronic device's sensitivity to damage caused by electrostatic discharge, such as can be caused by a spark jumping between the electronic device and its user.

BACKGROUND OF THE INVENTION

Electrostatic discharges (ESD) can damage semiconductor electronic parts, rendering them inoperative. Some electronic parts are more prone to such damage than others; and electronic parts can be designed to be resistant to ESD. An objective standard for testing the sensitivity of electronic devices to ESD has been formulated and is given in the military specification MIL-STD-883C, Notice 7, Method 3015.6 entitled *Electrostatic Discharge Sensitivity Classification* which is hereby incorporated by reference.

A prior art circuit designed to simulate an ESD from a human body source is shown in FIG. 1. A regulated high-voltage power supply 10 charges a capacitor 12 through a switch 14 and a resistor 16. The voltage is adjustable to test various levels of ESD sensitivity and may be set from zero volts to plus or minus 10 kilovolts. After the capacitor 12 is charged, the switch 14 is operated, discharging the stored charge through a 1500 ohm resistor 18. The two contact pins of the device under test (DUT) 20 connected to the test circuit experience a high-voltage, fast rise-time signal pulse, simulating an electrostatic discharge.

The charge-discharge cycle is repeated a predetermined number of times at both positive and negative voltage polarities. For electronic devices having more than two contact pins, the series of charge-discharge cycles must be repeated for each pairing of pins. The testing procedure can take vast amounts of time for a typical multi-pin electronic device. After subjecting the electronic device to the simulated ESD, it is then tested for correct operation. Devices that fail at one voltage level may pass at a lower level. Thus, a device's resistance to ESD may be reliably quantified.

Weil U.S. Pat. No. 4,721,899 and Richman U.S. Pat. No. 4,742,427 both disclose devices which can generate high-voltage, fast rise-time pulses for testing ESD sensitivity. However, neither reference discloses a means for routing the pulses to selected pins of the DUT to speed the tedious testing procedure.

Lutz U.S. Pat. No. 4,617,542 discloses a switch for switching such signals consistently. However, the disclosed switch is intended to be used in place of switch 14 of FIG. 1. As such, its construction solves the problem of switch bounce not confronted for the present problem of routing. The routing switches may be closed and allowed to settle before activating switch 14.

In earlier reed relay switches used in ESD testing devices, the reed contacts capacitively coupled with the relay's electromagnet windings, thus decreasing the rise-time of signals passing through the switch. This rise-time problem was solved by interposing a conductive shield between the reed contacts and the windings, thus forming a coaxial transmission line. Unfortunately, the capacitance between the shield and the rest of the external circuitry forms a high quality factor (hereinafter "Q") circuit, causing the signal to oscillate or "ring."

What is needed is a switch system for routing high-voltage signals with short rise-times while maintaining consistent pulse shapes and minimizing ringing.

SUMMARY OF THE INVENTION

The present invention provides means for routing high voltage pulses to various selected pins of a device under test, without causing pulse shape degradation, thus overcoming the above-mentioned short-comings and drawbacks of the previously available practices of routing.

In accordance with the present invention, many reed-type relays are used. The relays are used to selectively connect a first selected pin of the DUT to a pulse generator and connect a second selected pin of the DUT to ground. The DUT's remaining pins are left open circuited or "floating," connected to neither ground nor the pulse generator.

The switching arrangement is designed to present a constant impedance to the pulse generator regardless of which pin of the DUT is connected to the pulse generator. A damping circuit may also be present to minimize the effects of ringing.

The relay's ferromagnetic contacts are plated with copper to minimize skin effect and thus decrease the pulse's rise-time. Interposed between the glass enclosure and the electromagnetic coil of each reed relay is a conductive shield preferably comprising a copper-plated polyimide sheet formed into a tube. At each end of the tube, the copper plating is connected to ground voltage via a resistor. The copper plating effectively transforms the reed relay into a coaxial transmission line, minimizing coupling between the relay contacts and the many windings of the relay's electromagnet. The resistors convert the capacitances between the copper plating and the remainder of the ESD testing device's circuitry into "lossy" capacitors, lowering their Q, and thus minimizing ringing of the pulse signal.

It is therefor a principal object of the present invention to provide an apparatus for selectively routing a high-voltage, short rise-time pulse signal without degrading its shape.

It is another object of the present invention to eliminate skin effect in a reed relay.

It is another object of the invention to present to a pulse generator a constant impedance regardless of the selected routing.

The foregoing and other objectives, features and advantages of the present invention will be more readily understood upon consideration of the following detailed description of the invention taken in conjunction with the accompanying drawings.

BRIEF DESCRIPTION OF THE DRAWINGS

FIG. 1 is a schematic diagram of a model for a human electrostatic discharge source.

FIG. 2 is a schematic diagram of an embodiment of an arrangement according to the present invention.

FIG. 3 is a schematic diagram of another embodiment of a switching arrangement according to the present invention.

DESCRIPTION OF THE PREFERRED EMBODIMENT

Figure 4:
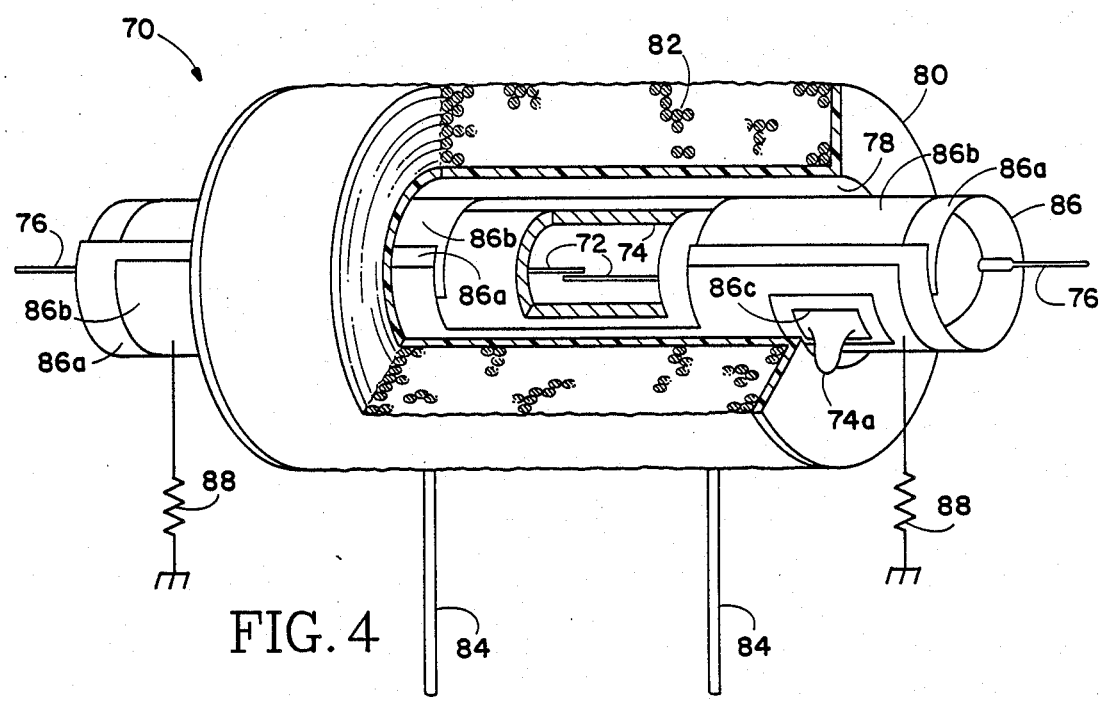
FIG. 4 is a partially cut-away perspective view of a switch according to the present invention.

Referring now to the drawings where like reference numbers refer to the same element, and with particular attention to FIG. 2, an embodiment of a switching arrangement for routing high-voltage, fast rise-time signals according to the present invention is shown.

A pulse generator 30 capable of producing high-voltage, fast rise-time pulses, and which may be similar to the pulse generator (excluding the 1500 ohm resistor 18) shown in FIG. 1, is attached to a distribution line 32. Attached to the distribution line 32 are a predetermined number (N) of identical switching circuits 34, only one of which is shown in FIG. 2. Additional switching circuits are attached to the distribution line 32 at locations 35. Each switching circuit 34 comprises a 1500 ohm resistor 36 and two switches 38 and 40. The preferred structure of the switches 38 and 40 will be described in the discussion of FIGS. 4 and 5. Each switching circuit 34 also includes a terminal 42 for electrical connection to a pin of the device under test.

Since only small amounts of capacitance can be tolerated between the 1500 ohm resistors 36 and the terminals 42, the resistor 36 for each switching circuit 34 is located near the switches 38 and 40 rather than using one 1500 ohm resistor near the pulse generator 30.

In operation, one pin of the device under test is connected to the pulse generator 30 and another pin is connected to ground. For example, to connect the terminal 42 to the pulse generator 30, switch 38 is opened and switch 40 is closed. Similarly, to connect terminal 42 to ground, both switches 38 and 40 are closed. When the terminal is to be attached to neither ground nor the pulse generator 30, switch 38 is closed and switch 40 is opened. Thus the pulse generator 34 always sees a resistance of approximately 1500/(N-1) ohms caused by the N-1 1500 ohm resistors 36 in parallel connecting the pulse generator 30 to ground.

Damping resistor 44 and a damping capacitor 46 dissipate ringing caused by stray capacitances. In a present embodiment the damping resistor has a resistance of approximately 25 ohms and the damping capacitor 46 has a capacitance of approximately 15 picofarads.

Another embodiment of a switching arrangement according to the present invention is shown in FIG. 3. A primary distribution line 48 is connected to a pulse generator 30. The pulse generator 30 may be identical to the pulse generator of FIG. 1, excluding the 1500 ohm resistor 18. Connected to the main distribution line 48 via secondary selection switches 49 are M secondary distribution lines 50, only one of which is shown. Attached to each secondary distribution line 50 are N identical switching pairs 52, only one of which is shown, and referenced generally by reference number 52. The switching pairs 52 may be positioned a distance from the main distribution line 50 by using a transmission line 51.

The remainder of the switching pairs not illustrated are connected to the secondary distribution line 50 at locations 53. For example, an ESD testing device may have one primary distribution line 48, eight secondary distribution lines 50, with twenty switching pairs 52 connected to secondary distribution line 50, for a total of 320 terminals 42.

Each switching pair 52 includes two terminals 42a and 42b for electrical connection to a pin of the device under test. Each terminal 42a and 42b may be connected to the pulse generator 30 via a 1500 ohm resistor and the secondary and primary distribution lines 50 and 48 or may be connected to ground depending on the states of switches 56, 58, 60, and 62. For example, terminal 42a may be connected to the pulse generator 30 by closing switch 56 and opening switch 58 or attached to ground by opening switch 56 and closing switch 58. If the terminal 42a is to be floated, both switches 56 and 58 are opened. Similar states of switches 60 and 62 determine whether terminal 42b is connected to the pulse generator 30 or ground.

As in the embodiment shown in FIG. 2, the 1500 ohm resistors 54 are located near the terminals 42a and 42b to decrease the capacitance between the terminals and the resistors. One resistor is used per pair of terminals to decrease cost. More terminals per resistor may be used, the capacitance after the resistor being the limiting factor.

Unlike the first embodiment shown in FIG. 2, no load is placed on the pulse generator 30 by a terminal being floated. A terminating resistor 63, having a resistance equal to the characteristic impedance of the secondary distribution line 50, terminates each secondary distribution line 50.

A fifth switch 64, operated in conjunction with switches 56 or 60, may be closed to connect a selected terminal 42a or 42b via signal line 66 to another testing device such as a curve tracer. Signal line 66 is common to all switching pairs 52 in the ESD testing device. After the selected pins of the device under test are subjected to signal pulses, they may be individually connected to the curve tracer to check the device for failure. In this manner, the device under test need not be removed from the ESD testing device to complete the testing process.

Figure 5:
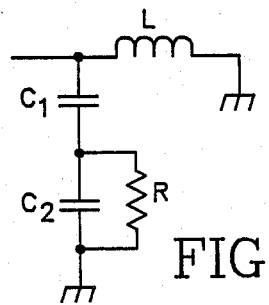
FIG. 5 is a schematic equivalent circuit diagram of the switch.

Referring now to FIG. 4, a switch 70 according to the present invention is shown in a partial cutaway view. The switch 70 comprises two reed contacts 72, each having a ferromagnetic core plated with copper, surrounded by an air-tight glass enclosure 74 and having external connectors 76. The glass enclosure 74 passes through the central aperture 78 of a spool 80. Windings 82 are wrapped on the spool 80 for creating a magnetic field which causes the reed contacts 72 to touch one another. The windings 82 have terminals 84 for selectively connecting to a power supply. The state of each relay may thus be remotely controlled, allowing the testing process to be completely controlled by a computer, if desired.

A tube-shaped shield 86 is interposed between the glass enclosure 74 and the spool 80. An opening 86c in the shield 86 allows the nipple 74a of the glass enclosure 74 to pass therethrough. The shield substrate 86a is made from a dielectric material such as polyimide and prevents electrical arcing between the external connectors 76 and the windings 82. A conductive plating 86b, preferably of copper, is deposited on one surface of the shield 86, with an unplated margin adjacent the edge of the shield 86 and the opening 86c. Preferably, the surface on the exterior of the tube is the plated surface. The conductive plating 86b minimizes capacitive coupling between the reed contacts 72 and the windings 82. The conductive plating 86b also transforms the switch 70 into a coaxial transmission line. It will be appreciated by one skilled in the art that the dielectric material 86a need not be a rolled sheet as shown in FIG. 4, but may be solid tube. Furthermore, the conductive plating 86b may also be replaced with a separate cylindrical conductive material, such a braided wire.

At each end of the shield 86, the metal plating 86b is connected to ground via a resistor 88. The function of the resistors 88 is made apparent in an equivalent circuit model of the switch 70 shown in FIG. 5. The inductor L shown is the equivalent inductance of the switch 70. Capacitor $C_1$ is the capacitance between both reed contacts 72 and the conductive plating 86b; capacitor $C_2$ is the capacitance between the conductive plating 86b and the balance of the ESD testing device's circuitry. At the operating frequencies (the rise time of a pulse is less than 5 nano-seconds resulting in a bandwidth of approximately 70 mega-Hertz), inductor L and capacitors $C_1$ and $C_2$ have values of approximately 200 nano-Henries, 6 pico-Farads, and 9 pico-Farads. Resistor R is the parallel combination of the two resistors 88 and thus has a value of approximately 17.5 ohms. Resistor R converts the capacitor $C_2$ between the copper plating and the remainder of the ESD testng device's circuitry into a "lossy" capacitor, lowering its Q, and thus minimizes ringing of a signal passed through the switch 70. As a capacitance upstream of the 1500 ohm resistor does not cause ringing problems, the shields 86 of the secondary selection switches 49 are connected directly to ground.

As stated before, only a minimum amount of capacitance can be tolerated downstream of the 1500 ohm resistor 54 without causing too much ringing. The importance of lowering the capacitance of the switches can be seen in FIG. 3. Suppose terminal 42a is connected to the pulse generator 30 and terminal 42b is floating; thus switch 56 is closed while switches 58, 60, 62, and 64 are open. Resistor 54 is thus connected to switches 56, 58, 60, and 64. Of these switches, only switch 56 is closed. However the other switches still have a capacitance between the one connected reed contact and their respective shields which is approximately half that of $C_1$, or three pico-Farads. Furthermore, each of these switches also has the equivalent capacitance of $C_2$.

The terms and expressions which have been employed in the foregoing specification are used therein as terms of description and not of limitation, and there is not intention, in the use of such terms and expressions, of excluding equivalents of the features shown and described or portions thereof, it being recognized the scope of the invention is defined and limited only by the claims which follow.

What is claimed is:

1. A switch for selectively passing high-voltage, fast rise-time signals between a first external circuit node and a second external circuit node in a circuit having a ground reference, comprising:
   (a) first and second connector means for connecting to the first and second external circuit nodes, respectively;
   (b) selectively openable and closeable switch contact means for selectively providing an electrical conduction path between said first and second connector means;
   (c) electromagnetic means for selectively opening and closing said switch contact means;
   (d) a dielectric tube surrounding said switch contact means and having a metal plating thereon, said dielectric tube being interposed between said electromagnetic means and said switch contact means; and
   (e) a resistor electrically connecting said metal plating of said dielectric tube to said ground reference.

2. The switch of claim 1 wherein said switch contact means comprise a core of ferromagnetic material plated with a contact metal having a conductivity higher than that of said ferromagnetic material.

3. The switch of claim 2 wherein said contact metal is copper.

4. The switch of claim 1 wherein said dielectric tube is interposed between said switch contact means and said metal plating.

5. The switch of claim 1 wherein said dielectric tube comprises a polyimide sheet and said metal plating comprises copper.

6. The switch of claim 1 wherein said electromagnetic means comprises a cylindrical coil surrounding said switch contact means, said dielectric tube being interposed between said coil and said switch contact means in substantially coaxial relation to both.

7. Apparatus for selectively passing high-voltage, fast rise-time signals to a device under test, comprising:
   (a) an electrical circuit having a pulse generator, a ground reference, and connector means for detachably connecting to the device under test;
   (b) selectively openable and closable switch contact means for selectively providing an electrical conduction path between said pulse generator and said connector means;
   (c) electromagnetic means for selectively opening and closing said switch contact means;
   (d) a dielectric tube surrounding said switch contact means and having a metal plating thereon, said dielectric tube being interposed between said electromagnetic means and said switch contact means; and
   (e) a resistor electrically connecting said metal plating of said dielectric tube to said ground reference.

8. Apparatus for selectively passing high-voltage, fast rise-time signals to a device under test, comprising:
   (a) an electrical circuit having a pulse generator, a ground reference, and connector means for detachably connecting to the device under test;
   (b) selectively openable and closable switch contact means for selectively providing an electrical conduction path between said pulse generator and said connector means;
   (c) electromagnetic means for selectively opening and closing said switch contact means;
   (d) a conductive shield surrounding said switch contact means and interposed between said electromagnetic means and said switch contact means; and
   (e) resistor means electrically connecting said shield to said ground reference for causing the frequency-dependent quality factor between said shield and other elements of said circuit to be less than if said shield were directly connected to said ground reference.

* * * * *